US006829469B1

(12) United States Patent
Henriksson

(10) Patent No.: US 6,829,469 B1
(45) Date of Patent: Dec. 7, 2004

(54) METHOD AND A DEVICE FOR PRODUCING A SIGNAL

(75) Inventor: Markku Henriksson, Oulu (FI)

(73) Assignee: Nokia Corporation, Espoo (FI)

(*) Notice: Subject to any disclaimer, the term of this patent is extended or adjusted under 35 U.S.C. 154(b) by 388 days.

(21) Appl. No.: 10/049,001

(22) PCT Filed: Aug. 23, 2000

(86) PCT No.: PCT/FI00/00715

§ 371 (c)(1),
(2), (4) Date: Feb. 4, 2002

(87) PCT Pub. No.: WO01/20791

PCT Pub. Date: Mar. 22, 2001

(30) Foreign Application Priority Data

Sep. 16, 1999 (FI) ............................................. 19991977

(51) Int. Cl.[7] ................................................ H04B 1/40
(52) U.S. Cl. .......................... 455/76; 455/75; 455/113; 455/119; 455/255; 455/257; 455/258; 455/266; 375/316; 375/326; 375/327; 375/344; 375/219; 375/376
(58) Field of Search .......................... 455/75, 76, 113, 455/119, 255, 257, 258, 260, 265; 375/316, 326, 327, 344, 219, 376, 325

(56) References Cited

U.S. PATENT DOCUMENTS 5,203,032 A * 4/1993 Usui ........................ 455/182.2
6,061,575 A * 5/2000 Lombardi ................. 455/552.1
6,628,927 B1 * 9/2003 Samuels ....................... 455/77

FOREIGN PATENT DOCUMENTS

EP          0 752 761 A2    1/1997
EP          0 793 356 A2    9/1997
WO          WO 84/04637     11/1984

* cited by examiner

Primary Examiner—Vivian Chin
Assistant Examiner—Minh D. Dao
(74) Attorney, Agent, or Firm—Harrington & Smith, LLP

(57) ABSTRACT

A method for producing an output signal (42) with a specific frequency from an input signal (40) received, the frequency of which changes quickly in steps of the size of an input frequency resolution or a multiple of the input frequency resolution, on the input frequency band. Furthermore, a method is presented for producing an output signal (72) from an input signal (70) with a specific frequency, and for changing the frequency of the output signal (72) quickly in steps of the size of an output frequency resolution or a multiple of the output frequency resolution, on the output frequency band. Methods, as well as a receiver and a transmitter that implement the methods are based on the setting of an intermediate frequency from an intermediate frequency band, which comprises at least two different values. The difference between the values, i.e. the intermediate frequency resolution, is higher than the input or output frequency resolutions. Thus, it is possible to use local oscillators (43), (45), (73), (75), the frequency resolution of which is higher than the input and output frequency resolutions and improves the settling time of the receiver or transmitter. Methods according to the invention as well as transmitters and receivers that implement the methods according to the invention are utilized particularly in cellular networks that use frequency hopping.

45 Claims, 3 Drawing Sheets

METHOD AND A DEVICE FOR PRODUCING A SIGNAL

SCOPE OF INVENTION

The present invention relates to radio transmitters and receivers. The object of the invention is to present a new method for producing a low frequency output signal from a frequency hopping input signal and a second method for producing a frequency hopping output signal from a low frequency input signal.

In particular, the invention relates to a method for producing, in a receiver, a first output signal, which has a specific first output frequency, from a first input signal the frequency of which changes quickly in steps of the size of the channel spacing or a multiple of the channel spacing of a mobile communication system within the frequency range of the mobile communication system. Furthermore, the invention relates particularly to a method for producing, in a transmitter, an output signal the frequency of which belongs to the frequency band of a mobile communication system, from a second input signal, which has a specific second input frequency and, further, for changing the second output frequency in steps of the size of the channel spacing or a multiple of the channel spacing of the mobile communication system, on the mobile communication system frequency band.

Further, the invention relates particularly to a receiver, a transmitter and a frequency synthesiser, wherein the method according to the invention is applied to a frequency synthesis, which implement the methods according to the invention. Methods according to the invention, the receivers and transmitters implementing the methods, as well as the frequency synthesiser based on the methods, can be used, in addition to the GSM system, in any radio system where the transmitting and receiving frequency is being changed.

BACKGROUND OF INVENTION

In transmitters and receivers used in mobile communication systems, it must be possible to quickly change the transmitting and receiving frequency. This is particularly important in cellular networks that use frequency hopping. Frequency hopping is an efficient countermeasure for preventing harmful phenomena due to the radio channel's properties and interference.

Rayleigh fade is a major problem especially in data transmission from a base transceiver station to a terminal. This can be seen particularly as a large variation in the received signal level. The variation in the level of the received signal is a problem that occurs particularly in slowly moving terminals. This means that a terminal may stay for a long time in a place where the received signal level is poor.

Rayleigh fade is frequency-dependent by its nature. In frequency hopping, successive bursts are sent at different frequencies. If the difference between these frequencies is sufficient, the fading properties of the frequencies in a radio channel can be considered to be independent of each other. In this case, the probability that two erroneous bursts are received decreases.

A second benefit to be gained by frequency hopping is interference diversity. In a busy traffic area, for example, in big cities, a network's capacity is limited due to interference resulting from the re-use of frequencies. When the same frequency is being used in adjacent cells simultaneously, the frequencies interfere with each other. When using slow frequency hopping, the probability that the received signal and the interfering signal are simultaneously at the same frequency is reduced.

Adjustable local oscillators used in radio transmitters and receivers are often frequency synthesisers. A frequency synthesiser is normally based on a phase-locked loop the operation of which is based on an oscillator locked in a reference frequency.

A frequency synthesiser has a certain frequency resolution and settling time. The frequency of a signal produced by a frequency synthesiser can be changed in steps of the size of the frequency resolution or a multiplier of the frequency resolution. The changing of the frequency and locking in the desired frequency take place during the settling time. The settling time can be shortened by broadening the bandwidth of the filter of a phase-locked loop or by increasing the phase-comparison frequency. A disadvantage is that the increasing of the bandwidth of the phase-locked loop inevitably follows an increase in phase error. The phase-comparison frequency of conventional frequency synthesisers is equal to the frequency resolution. A fractional-n synthesiser has improved the settling time of conventional frequency synthesisers. The synthesiser in question is based on a conventional solution the phase-comparison frequency of which has been increased n-fold. Currently, mainly 5- and 8-fold fractional-n synthesisers are being used. For example, a basic solution, the frequency resolution and phase-comparison frequency of which are 200 kHz, can be speeded up by using, for example, a fractional-n synthesiser the frequency resolution of which is 200 kHz and the phase-comparison frequency 1 MHz (modulo-5).

There are several different means of implementation for the change of receiving and transmitting frequencies. In the basic solution of a Superheterodyne receiver, a local oscillator is used in a first intermediate frequency stage, the frequency of a local oscillator signal produced by it being adjustable. A frequency synthesiser, the frequency resolution of which is equal to the frequency resolution of the received signal, is used as the local oscillator. An input signal is down-converted into an intermediate frequency signal by mixing the intermediate frequency signal and the local oscillator signal. The intermediate frequency signal is further down-converted into an output signal by mixing the intermediate frequency signal and the local oscillator signal of a second intermediate frequency phase. The signal is detected from the output frequency. The first intermediate frequency is constant and the local oscillator of the second intermediate frequency stage operates at a constant frequency.

In the basic solution of a Superheterodyne transmitter, a local oscillator is used in a first intermediate frequency stage, the frequency of a local oscillator signal produced by it being constant. An input signal is up-converted by a first local oscillator signal into an intermediate frequency, the frequency of which is also constant. The intermediate frequency is further mixed by the local oscillator signal of a second intermediate frequency stage to a desired transmitting frequency. A transmit signal with the desired frequency is produced by adjusting the frequency of the second local oscillator signal and by mixing the second local oscillator signal and the intermediate frequency signal. The frequency of the local oscillator signal is the difference or sum of the transmit signal frequency and the intermediate frequency.

The problem with the basic solutions is the length of the settling time with the required frequency resolutions. For instance, in the GSM system (GSM, Global System for Mobile communications), channel spacing is 200 kHz and so the settling time of conventional frequency synthesisers is far too slow. On the other hand, the phase-comparison frequency of the currently available fractional-n synthesisers is normally 5- or 8-fold compared to the frequency resolution, and frequency locking takes about 40 phase-comparison periods of a phase-locked loop. This being the case, a phase-comparison frequency of 1.6 MHz (modulo 8) and 25 microsecond (=1/1.6 MHz*40 periods) settling times at best are achieved by fractional-n synthesisers, the frequency resolution of which is 200 kHz.

In a GSM network that uses frequency hopping, the frequency is changed after each burst. In between the bursts, there is a guard period, which is 8.25 bits long, i.e., which lasts for 30 microseconds. For example, in a base transceiver station, the changing and locking of a frequency should take place during a period less than half a guard period of a burst. Thus, the base transceiver station's settling time should be distinctly less than 15 microseconds. In this case, the phase-comparison period can be 0.375 microseconds (=15 µs/40 periods) at a maximum, i.e. the phase-comparison frequency must be no less than 2.67 MHz. This can be achieved by neither conventional frequency synthesisers, nor by even the fastest fractional-n synthesisers.

The settling time of the basic solution of a receiver described above can be speeded up by using, in a first intermediate frequency stage, two local oscillators according to FIG. 1. In the receiver shown in FIG. 1, in the first intermediate frequency stage, a switch, a mixer and two local oscillators are used by which a received signal is converted into an intermediate frequency signal. The local oscillators are connected to the switch, which has been connected to the mixer's local oscillator input. A signal of the desired local oscillator is selected by controlling the switch.

The frequency of the local oscillators is adjustable. During a first timeslot, the signal produced by the first local oscillator is ready selected at the mixer input and the frequency of the signal of the second local oscillator is adjusted as desired. When the time slot changes to the next one, a second oscillator signal is switched to the mixer's local oscillator input and the adjustment of the frequency of the first local oscillator signal is commenced.

In a second intermediate frequency stage, a single local oscillator is used. The intermediate frequency signal is converted in the mixer further into an output signal. This takes place by mixing the intermediate frequency signal with a signal produced by a third local oscillator. The third local oscillator operates at a fixed frequency.

An advantage of the solution described above is the speeding up of the time used for changing the frequency compared to the basic solution, because the frequency of one local oscillator can be adjusted at the same time as the other is producing the local oscillator signal to be used in the first intermediate frequency phase. The problem is that a local oscillator signal that has not been selected, leaks through the switch to the mixer's local oscillator frequency input and produces harmful mixing products for the intermediate frequency. Furthermore, the signal leaking through the switch and the signal of the selected local oscillator produce intermodulation products that further produce harmful mixing products for the intermediate frequency. These harmful mixing products cannot be filtered off, because their frequencies are on the pass band of the intermediate frequency filter. The problem can be mitigated by using several series-connected switches, mechanical partitions or buffer amplifiers. However, the number of components required in the circuit increases, whereupon the circuit consumes more power and requires a larger surface area.

In one transmitter according to FIG. 2, a single local oscillator and mixer are used in a first intermediate frequency phase for converting an input signal into an intermediate frequency signal. This takes place by mixing the local oscillator signal of the first intermediate frequency phase with the intermediate frequency signal. The local oscillator in question operates at a fixed frequency.

In a second intermediate frequency stage, a switch, a mixer and two local oscillators are used for converting an intermediate frequency signal into an output signal. The local oscillators are connected to the switch, which is further connected to the mixer's local oscillator input. A signal of the desired local oscillator is selected with the switch.

The frequency of the second intermediate frequency phase is adjustable. During a first time interval, the signal produced by the second local oscillator is ready selected at the local oscillator input of the mixer and the frequency of a signal produced by the third local oscillator is adjusted as desired. As the time interval changes to the next one, the third local oscillator signal is switched to the mixer's local oscillator input and the adjustment of the second local oscillator signal is commenced.

An advantage of the transmitter according to FIG. 2 is the speeding up of the time required for changing the frequency according to the receiver described above. The problem is that harmful mixing products are produced and the large amount of components, the circuit's power consumption and the need for surface area, as in the receiver solution shown in FIG. 1.

FIG. 3 shows a frequency synthesiser according to prior art. An attempt has been made to speed up the settling time of the frequency synthesiser by using two phase-locked loops instead of one. As in the solutions according to FIGS. 1 and 2, the frequency of the second phase-locked loop is adjusted at the same time as the first phase-locked loop is producing the frequency synthesiser output signal.

When transferring onto the next output frequency, the position of the switch is changed, whereupon the second phase-locked loop connects to the frequency synthesiser output and the adjustment of the frequency of the first phase-locked loop is commenced. The disadvantage of the solution in question is the large amount of components, because the switches require control and buffing against changing impedance. Therefore, the solution in question consumes a lot of power and requires a large surface area.

SUMMARY OF THE INVENTION

In the following, a new method will be presented for producing in a receiver an output signal, which has a specific frequency, from an input signal, the frequency of which changes in steps of the size of an input frequency resolution or a multiple of the input frequency resolution, on an input frequency band. In a method according to the invention, the input signal has an input frequency, which changes in steps of the size of the input frequency resolution or a multiple of the input resolution, on the input frequency band. The input frequency band is preferably within the frequency range of a GSM network and the input frequency resolution is preferably the difference between the GSM system channels. The output signal is preferably a signal, which is input to the receiver demodulator.

The basic idea of the invention is that when converting an input signal into an intermediate frequency signal, a value is set for the intermediate frequency from an intermediate frequency band, which comprises at least two different values. The difference between the values of the intermediate frequency band, i.e. the intermediate frequency resolution, is higher than the input frequency resolution. This, in turn, enables the use of local oscillators, the frequency resolution of which is higher than the input frequency resolution, in a receiver.

Normally, an input signal is converted into an intermediate frequency signal by down-converting, whereupon the intermediate frequency is lower than the input frequency. In some cases, the input signal can also be up-converted, whereupon the intermediate frequency is higher than the input frequency. Methods according to the invention operate well in either way. The intermediate frequency signal is further down-converted into an output signal, whereupon the output signal frequency is lower than the input signal frequency.

Further, a new method is presented for producing an output signal from an input signal, which has a specific input frequency, and for quickly converting the frequency of the output signal, on the output signal frequency band.

In the method, the output signal has an output frequency, which is changed in steps of the size of an output frequency resolution or a multiple of the output frequency resolution, on the output frequency band. The output frequency is preferably within the GSM system frequency range and the output frequency resolution is preferably the difference between the GSM system channels. The basic idea of the method according to the invention is the same as in the receiver, i.e. the conversion of an input signal into an intermediate frequency signal so that the intermediate frequency is set from at least two values belonging to an intermediate frequency band. The difference between the values that belong to the intermediate frequency band, i.e. the intermediate frequency resolution, is higher than the output frequency resolution.

In methods according to the invention, the conversion of input signals into an intermediate frequency signal and the down- and up-conversion of the intermediate frequency signal to output signals take place by mixing in a manner know to a person skilled in the art. The information contained by the input signal is preserved when converting the signal into an output signal.

Considerable advantages are gained by the inventions compared to solutions according to prior art. The gained advantages depend on whether conventional frequency synthesisers or fractional-n synthesiser are used in the solutions. In both cases, quick settling times are achieved by a transmitter and a receiver that implement the method, without impairing the frequency resolution. When comparing, for example, a solution according to the invention, where the intermediate frequency is selected from two frequencies, to a basic solution according to prior art, where conventional frequency synthesisers are used, the settling time of the solution according to the invention is nearly half of the solution according to prior art. In a solution according to the invention, the use of two intermediate frequencies enables the use of a local oscillator, the frequency resolution of which is twice the input frequency resolution and, thus, the division of the settling time in half compared to the basic solution of a transmitter. Correspondingly, three intermediate frequencies enable a three-fold frequency resolution of a first local oscillator compared to the input frequency resolution and, thus, the reduction of the receivers settling time to one third compared to a conventional solution. If conventional frequency synthesisers are replaced by fractional-n synthesisers, the receiver's settling time decreases further.

When comparing a transmitter and a receiver that implement the methods according to the invention, to solutions where two local oscillators selected by a switch are used, the settling time of the transmitter or receiver according to the invention remains good, but the need for components and the power consumption of the circuit decreases and the surface area required by the circuit becomes substantially smaller. The decrease in power consumption and the need for smaller surface area result from the fact that no switch, switch control, buffer amplifiers or mechanical partitions are required. Neither do spurious responses and harmonic frequencies cause a problem, because only one local oscillator is used instead of two local oscillators selected with a switch.

According to the invention, it is also possible to implement a frequency synthesiser, which is considerably faster than a frequency synthesiser according to prior art and the frequency resolution of which is, however, at least as good as in a solution according to prior art. The advantages of a method according to the invention and of a frequency synthesiser based on said method are the same advantages as in the transmitter and receiver, i.e. a quick settling time and a simple implementation, because no switch, switch control, buffer amplifiers or mechanical partitions are required. Thus, the power consumption of the synthesiser decreases compared to a solution according to prior art, and the circuit consumes less power. Furthermore, the local oscillator frequency bands can be selected so that the mixer produces an output signal on the desired frequency band and the other mixing products are produced at a sufficient distance from the output signal frequency band. Therefore, after the mixer, no filtering is necessarily required, but the output signal obtained from the mixer can be directly switched, for example, to the next mixer.

The problems presented above can be avoided by methods according to the invention and by transmitters, receivers and frequency synthesisers implementing the methods. The settling times of transmitters, receivers and frequency synthesisers implemented according to the invention are reduced considerably without impairing the frequency resolution. The need for components in the circuits also decreases, whereupon the circuits consume less power and need a smaller surface area compared to solutions according to prior art. The time for changing the frequency of receivers and transmitters implemented according to the methods can be speeded up further independent of the time required for changing the frequency of the frequency synthesisers available each time. In addition to the advantages mentioned above, the advantages of transmitters, receivers and frequency synthesisers according to the inventions are also their ease of implementation and simple structure.

In particular, the inventions will benefit mobile stations where fast frequency settling time is needed in a base transceiver station, and mobile stations where fast frequency settling time, low power consumption and small circuits are required. The invention is characterised by what has been stated in the claims.

LIST OF DRAWINGS

In the following, the invention will be explained in detail by referring to the enclosed drawings, in which FIG. 1 shows a receiver that changes the frequency, according to prior art;

DETAILED DESCRIPTION OF INVENTION

Figure 1:
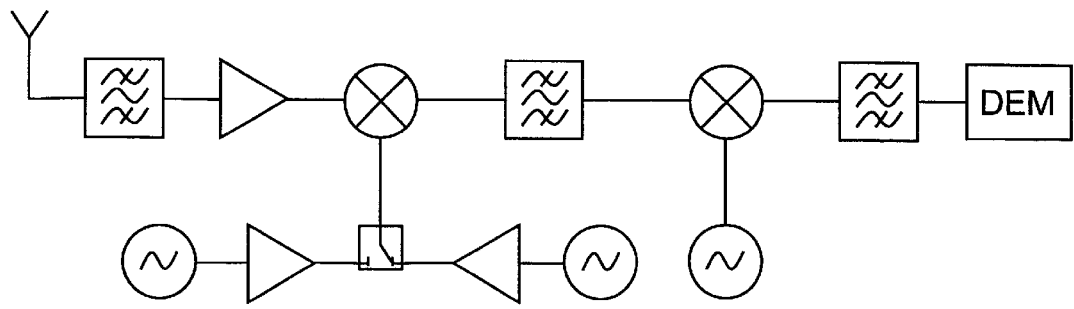
Figure 2:
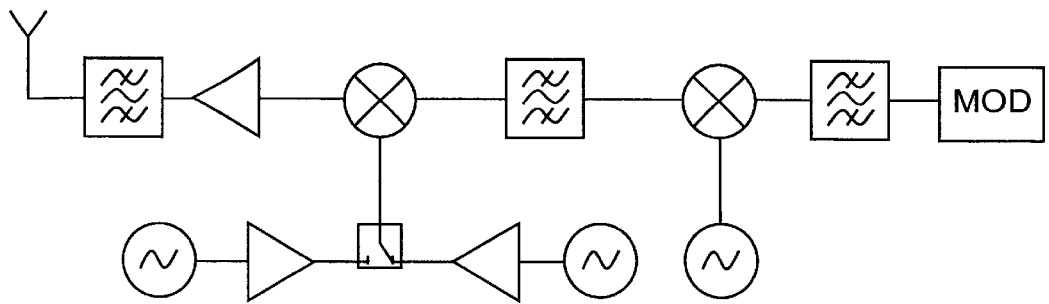
FIG. 2 shows a transmitter that changes the frequency quickly, according to prior art.
Figure 3:
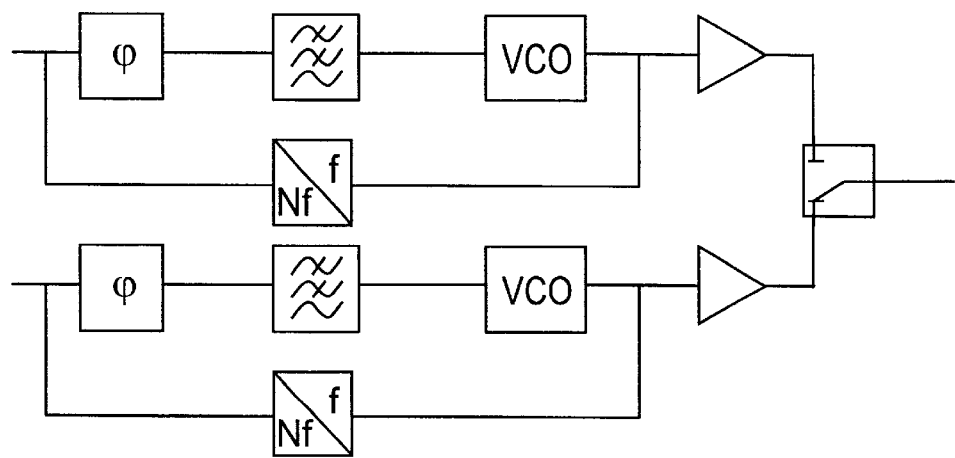
FIG. 3 shows a frequency synthesiser according to prior art.
Figure 4:
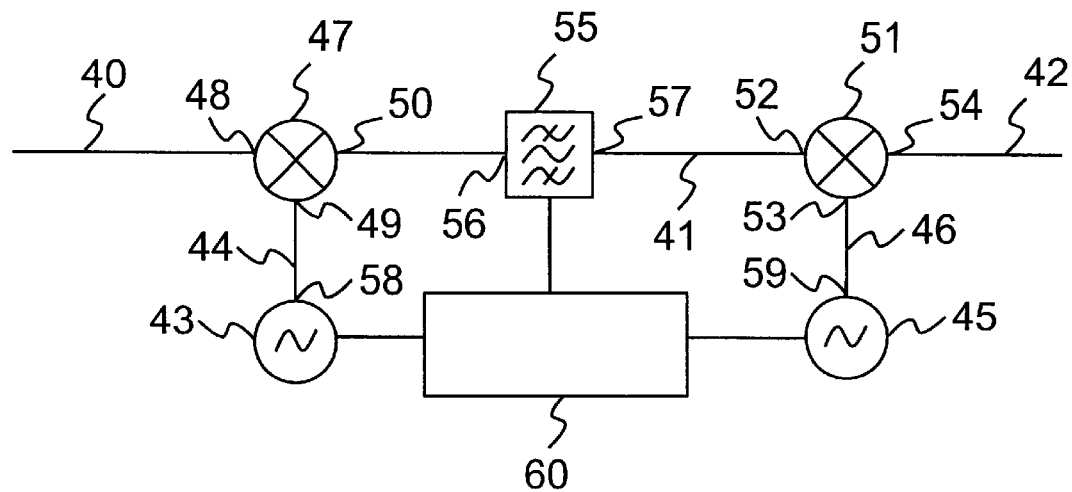
FIG. 4 is a block diagram of a receiver that implements a method according to the invention.

FIG. 4 is a block diagram of a receiver that implements a method according to the invention. It is illustrated in principle and the figure only comprises the most essential parts required for the understanding of a method and the operating principle of a receiver according to the invention.

A receiver implementing a method according to the invention for producing a first output signal 42, which has a specific output frequency, from a first input signal 40, which has an input frequency resolution and a first input frequency belonging to an input frequency band, which is arranged to change in steps of the size of the input frequency resolution or a multiple of the input frequency resolution, on the input frequency band, comprises:

a first local oscillator 43, which has a first frequency resolution, for producing a first local oscillator signal 44, which first local oscillator signal has an adjustable frequency, which obtains values from a first frequency band, and which values are at a distance of the first frequency resolution or a multiple of the first frequency resolution from each other;

a second local oscillator 45 for producing a second local oscillator signal 46, which has a frequency;

a first mixer 47 for producing a first intermediate frequency signal 41, which first mixer is arranged to convert the first input signal 40 by the first local oscillator signal 44, which first mixer has a radio frequency input 48 for receiving the first input signal, a local oscillator input 49 for receiving the first local oscillator signal and a first intermediate output 50 for outputting the first intermediate frequency signal;

a second mixer 51 for producing the first output signal 42, which second mixer is arranged to down-convert the first intermediate frequency signal 41 by the second local oscillator signal 46, and which second mixer has an intermediate frequency input 52 for receiving the first intermediate frequency signal, a local oscillator input 53 for receiving the second local oscillator signal and a second intermediate frequency output 54 for outputting the first output signal:

which first local oscillator comprises a first local oscillator output 58 for outputting the first local oscillator signal; and which second local oscillator comprises a second local oscillator output 59 for outputting the second local oscillator signal.

In a method according to the invention, the first output signal 42, which has a specific first output frequency, is produced from the first input signal 40. The first input signal 40 is preferably a radio signal received from a mobile communication network. The first output signal 42 is preferably a signal taken to a mobile station demodulator.

The first input signal 40 has an input frequency resolution and a first input frequency belonging to an input frequency band, which changes in steps of the size of the input frequency resolution or a multiple of the input frequency resolution, on the input frequency band. The input frequency resolution is preferably equal to channel spacing used in a mobile communication network and the input frequency band is preferably defined on the basis of the frequency range of the mobile communication system. For example, in the enhanced GSM system, a base transceiver station receives in a frequency range of 880–915 MHz and a terminal in a frequency range of 925–960 MHz. In the GSM system, a step is a change of the size of n*0.2 MHz, where n is an integer and the input frequency resolution is 0.2 MHz.

A method according to the invention comprises the steps of:

determining said first input frequency from the input frequency band;

producing the first local oscillator signal 44, which has a frequency, by the first local oscillator 43, which has the first frequency resolution, which frequency of the first local oscillator signal 44 obtains values from the first frequency band, and which values are at a distance of the first frequency resolution or a multiple of the first frequency resolution from each other;

producing the second local oscillator signal 46, which has a frequency, by the second local oscillator 45;

receiving said first input signal;

producing the first intermediate frequency signal 41, which has the first intermediate frequency, by converting the first input signal 40 by the first local oscillator signal 44;

producing the first output signal 42 by down-converting the first intermediate frequency signal 41 by the second local oscillator signal 46.

The determining of the first input frequency from the input frequency band takes place by informing the receiver of the next frequency to which the first input frequency will hop. This takes place, for example, on some mobile communication system channel that the receiver is monitoring.

The first frequency band can be, for example, 708.8–743.6 MHz and the first frequency resolution 0.4 MHz. This being the case, the frequencies of 708.8, 709.2, 709.6 . . . 743.6 MHz can be produced by the first local oscillator 43; the first local oscillator signal obtains values in question; and the frequency of the first local oscillator signal 44 can be changed in steps of the size of m*0.4 MHz, where m is an integer.

The basis of the invention is that the first intermediate signal 41 has a first intermediate resolution, which is higher than the input frequency resolution. Thus, it is possible to use local oscillators, the frequency resolution of which is higher than the input frequency resolution, and to reduce the settling time of the receiver. In this case, the first frequency resolution is higher than the input frequency resolution and the second local oscillator 45 has a second frequency resolution, which is higher than the input frequency resolution.

The first intermediate frequency obtains values from the first intermediate frequency band, which values are at a distance of the first intermediate frequency resolution or a multiple of the first intermediate frequency resolution from each other. The first intermediate frequency can be set, for example, from the values of 171.0 MHz and 171.6 MHz. Thus, the values in question belong to the first intermediate frequency band and, in this case, the first intermediate frequency resolution is 0.6 MHz. The intermediate frequency band is defined on the basis of the properties of one or more band-pass filters used in filtering means 55 and the requirements set on the settling time.

The first intermediate frequency band has at least as many values, as is the ratio of the first frequency resolution to the input frequency resolution. In this case, all frequencies that the first input frequency obtains from the input frequency band can be changed into a frequency belonging to the first intermediate frequency band. If the input frequency resolution is, for example, 0.2 MHz and the first intermediate frequency is selected from the first intermediate frequency band, whereto two values belong, the first frequency resolution is 0.4 MHz. The setting of the first intermediate frequency from a number of values enables the the use of local oscillators, the frequency resolutions of which are higher than the input frequency resolution and, thus, decreasing of the settling time of the receiver.

The frequency of the second local oscillator signal 46 obtains values from the second frequency band, which values are at a distance of the second frequency resolution or a multiple of the second frequency resolution from each other. The second frequency band has at least as many values, as the first intermediate frequency band has values. If the values of the first intermediate frequency band are, for example, 171.0 MHz and 171.6 MHz, and there is a desire that the first output frequency be 17.4 MHz, the second local oscillator should produce, in case of a lower injection, at least the frequencies of 153.6 MHz and 154.2 MHz, i.e. the differences of the first intermediate frequency and the first output frequency. In this case, the second frequency band reaches from 153.6 MHz to 154.2 MHz, and the second frequency resolution is 0.6 MHz. In a lower injection, the frequency of the local oscillator signal is the difference of the input frequency and the intermediate frequency. In an upper injection, the frequency of the local oscillator signal, in turn, is the sum of the input frequency and the intermediate frequency.

A method according to the invention comprises further a step, where the difference or sum of the first intermediate frequency and the first input frequency is adjusted as the frequency of the first local oscillator signal 44, and the difference or sum of the first intermediate frequency and the first output frequency is adjusted as the frequency of the second local oscillator signal 46, which said value of the first intermediate frequency is set from the first intermediate frequency band on the basis of the first input frequency and the first frequency resolution. The difference or sum depends on whether a lower or upper injection is used. If the first input frequency is, for instance, 914.4 MHz, the first intermediate frequency signal is set to 171.6 MHz and there is a desire that the first output frequency be 17.4 MHz, in case of a lower injection, 742.8 MHz is adjusted as the frequency of the first local oscillator signal and 154.2 MHz is adjusted as the frequency of the second local oscillator signal.

In a method according to the invention and in a receiver that implements the method, the first frequency resolution is the input frequency resolution multiplied by a first integer, which is higher than one. In the same way, the second frequency resolution is the input frequency resolution multiplied by a second integer, which is higher than one. The only common integer factor of the first integer and the second integer is one. Suitable values are, for example, the first frequency resolution multiplied by two and the second frequency resolution multiplied by any odd number higher than one, because two is not an integer factor in any odd number. The first frequency resolution can also be selected, for example, as three-fold, in which case the integer factor of the first integer, which is higher than one, is three. The second frequency resolution can then be, for example, two-, four-, five- or seven-fold, but not six- or nine-fold, because three is a common integer factor in six and nine. If the first and second integers had other common integer factors than one, some values of the first input frequency would be equivalent to two or more values of the first intermediate frequency band and, on the other hand, some of the values of the first input frequency could not be changed at all into the values of the first intermediate frequency band.

The first intermediate frequency resolution is the second frequency resolution multiplied by a third integer. In one preferred case, the third integer is one, i.e. the first intermediate frequency resolution is equal to the second frequency resolution. In this case, the frequency of the second local oscillator signal 46 is changed in steps of the same size as the first intermediate frequency. It would also be possible to use a solution, where the first intermediate frequency resolution is the second frequency resolution multiplied, for example, by four. In this case, when changing the first intermediate frequency by one step of the size of the first intermediate frequency resolution, the frequency of the second local oscillator signal is changed four times the second frequency resolution.

The first intermediate frequency resolution is defined on the basis of the second frequency resolution as was described above. When defining the first intermediate frequency resolution, however, it is possible to study the values that are suitable for the first intermediate frequency resolution, even though the second frequency resolution had not yet been set. This facilitates the designing of a receiver. The first intermediate frequency resolution can be found easily with the help of the following rule: If the first integer is x, and the first intermediate frequency resolution is the input frequency resolution multiplied by the integer y, not one of the values in the series [1 . . . x−1]*y is divisible by x. If the first integer is, for example, six, a three-fold resolution cannot be used as an intermediate frequency resolution because, in the series 3, 6, 9, 12, 15, the numbers six and twelve are divisible by six. Instead, a seven-fold second intermediate frequency resolution is possible because, in the series 7, 14, 21, 28, 35, not one of the numbers is divisible by six.

For example, a control unit 60 is used for controlling the first 43 local oscillator, the second 45 local oscillator and the filtering means 55. The control unit 60 can be a microcircuit or equivalent, and because its implementation is well known to a person skilled in the art, it is not discussed here in more detail. Means for setting the value of the first intermediate frequency can also be included in the same or separate control unit. The setting of the value of the first intermediate frequency comprises the steps of:

a) selecting a value from the first intermediate frequency band;
b) defining the difference or sum of the first input frequency and the selected value;
c) defining the quotient of the difference or sum and the first frequency resolution;
d) defining the remainder of the quotient;
e) if the remainder is zero, setting the selected value as the value of the first intermediate frequency;
f) if the remainder is not zero, selecting the next value from the first intermediate frequency band, and repeating the steps b–f.

The steps b–f are repeated until the remainder, which is zero, is achieved.

In the following, an example is given of the setting of the first intermediate frequency. In accordance with the previous examples, the first intermediate frequency used in a receiver is selected from the first intermediate frequency band, from the values 171.0 MHz and 171.6 MHz. The first local oscillator operates on the frequency band of 708.8–743.6 MHz. The first frequency resolution is 0.4 MHz, whereupon the frequencies 708.8, 709.2, 709.6 . . . 743.6 MHz can be produced by the first local oscillator. 880.4 MHz is set as the first input frequency from the input frequency band, i.e. frequency hopping to 880.4 MHz is carried out next. From the first intermediate frequency band, the value 171.0 MHz is selected whereupon, in case of the first lower injection, the difference of the input frequency and the selected value is calculated 880.4−171.0=709.4 MHz. When dividing the difference by the first frequency resolution, the quotient is 709.4/0.4=1773.5, the remainder of which, 0.5, is unequal to one. In practice, this means that the frequency in question cannot be produced by the first local oscillator 43 (instead, it could be possible to produce, for example, the frequencies 709.2 or 709.6 MHz). When selecting the value 171.6 MHz, the difference is 880.4−171.6=708.8 MHz. In this case, the quotient is 708.8/04=1771, the remainder of which is zero. Thus, 171.6 MHz is set as the first intermediate frequency. It is clear to a person skilled in the art that there are also other possible ways to study whether a signal can be produced by a local oscillator, the frequency of which is the sum or difference of two frequencies.

In a method according to the invention, it is not always even necessary to adjust the frequency of the second local oscillator signal 46. In a method according to the invention, in response to a change in the input frequency, which is equal to the first frequency resolution or a multiple of the first frequency resolution, the first intermediate frequency and the frequency of the second local oscillator signal are maintained constant. According to the previous examples, the first frequency resolution is 0.4 MHz. In the previous frequency change, for example, 171.6 MHz is set as the intermediate frequency and 154.2 MHz as the frequency of the second local oscillator signal. If the first input signal changes, for example, from the frequency of 880.2 MHz to the frequency of 881.0 MHz, i.e. by a step of the size of 0.8 MHz, the frequency of the first local oscillator is changed accordingly by a step of the size of 2*0.4 MHz, the first intermediate frequency is maintained as 171.6 MHz and the frequency of the second local oscillator signal as 154.2 MHz.

The first intermediate frequency signal 41 is produced in a receiver, for example, by intermixing the first input signal 40 and the first local oscillator signal 44 in the mixer 47. In one preferred embodiment, the receiver comprises the filtering means 55 for filtering the mixing products of the first mixer 47. Thus, it is possible to filter off unwanted mixing products produced while mixing, such as intermodulation products of the first intermediate frequency signal and the first local oscillator signal. The filtering means comprise an input 56 for receiving the mixing products produced by the mixer 47, one or more band-pass filters for producing the first intermediate frequency with the values of the first intermediate frequency band, as well as an output 57 for outputting the first intermediate frequency signal at a specific first intermediate frequency.

When using one band-pass filter, the band-pass filter lets through it the first intermediate frequency signal with all the values of the first intermediate frequency band and filters the other mixing products. If the values of the first intermediate frequency band are, for example, 171.0 and 171.6 MHz, a band-pass filter can be used the width of the pass band of which is, for example, 0.8 MHz and the medium frequency 171.3 MHz. When using two or more band-pass filters each band-pass filter lets through it one or more values of the first intermediate frequency band and filters the others. In this case, after the setting of the value of the first intermediate frequency, a band-pass filter that lets through it a specific first intermediate frequency is selected with a switch. The switch can be controlled, for example, with the same control unit as the first and second local oscillators. If the intermediate frequencies are, according to the previous example, 171.0 and 171.6 MHz, it is possible to use band-pass filters the medium frequencies of which are correspondingly 171.0 MHz and 171.6 MHz. If again four frequencies belong to the first intermediate frequency band, it is possible to use, for example, two band-pass filters one of which lets through it the lower half of the first intermediate frequency band and the other the upper half.

One or more frequency synthesisers based on a phase-locked loop are preferably used as the first local oscillator 43 and the second local oscillator 45. The frequency synthesisers can be, for example, conventional frequency synthesisers or fractional-n synthesisers.

Figure 5:
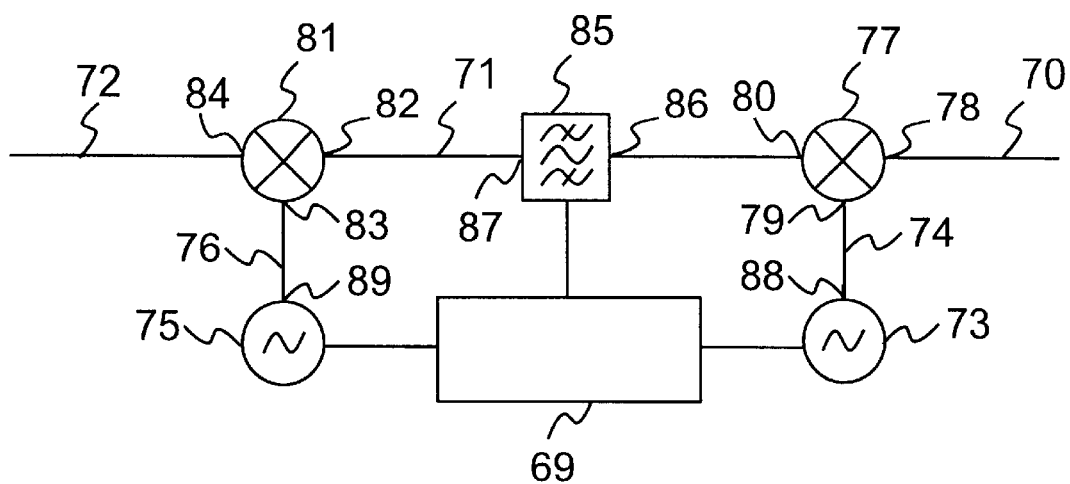
FIG. 5 is a block diagram of a transmitter that implements a method according to the invention.

FIG. 5 is a block diagram of a transmitter that implements a method according to the invention. It is illustrated in principle and the figure only comprises the most essential parts required for the understanding of the operating principle of the method and transmitter according to the invention.

A transmitter for producing a second output signal 72, which has a second frequency resolution and a second output frequency belonging to an output frequency band, from a second input signal 70, which has a specific second input frequency, and further for changing the second output frequency in steps of the size of the output frequency resolution or a multiple of the output frequency resolution on the output frequency band, which transmitter comprises:

a third local oscillator 73 for producing a third local oscillator signal 74;

a fourth local oscillator 75, which has a fourth frequency resolution, for producing a fourth local oscillator signal 76, which fourth local oscillator has an adjustable frequency, which obtains values from a fourth frequency band, and which values are at a distance of the fourth frequency resolution or a multiple of the fourth frequency resolution from each other;

a third mixer 77 for producing a second intermediate frequency signal 71, which third mixer is arranged to convert the second input signal 70 by the third local oscillator signal 74, which third mixer has an intermediate frequency input 78 for receiving the second input signal, a third local oscillator input 79 for receiving the third local oscillator signal and a second intermediate frequency output 80 for outputting the second intermediate frequency signal;

a fourth mixer 81 for producing the second output signal, which fourth mixer is arranged to up-convert the second intermediate frequency signal 71 into the second output signal 72 by the fourth local oscillator signal 76, which fourth mixer 81 has an intermediate frequency input 82 for receiving the second intermediate frequency signal, a local oscillator input 83 for receiving the fourth local oscillator signal and a radio frequency output 84 for outputting the second output signal;

which third local oscillator 73 comprises a third local oscillator output 88 for outputting the third local oscillator signal 74, and which fourth local oscillator 75 comprises a fourth local oscillator output 89 for outputting the fourth local oscillator signal 76.

A method for producing the second output signal, which has an output frequency resolution and a second output frequency belonging to an output frequency band, in a transmitter from the second input signal 70, which has a specific second input frequency, and further for changing the second output frequency in steps of the size of the output frequency resolution or a multiple of the output frequency resolution, on the output frequency band, which method comprises the steps of:

determining said second output frequency from the output frequency band;

producing the third local oscillator signal 74, which has a frequency, by the third local oscillator 73;

producing the fourth local oscillator signal 76, which has a frequency, by the fourth local oscillator 75, which has the fourth frequency resolution, which frequency of the fourth local oscillator signal obtains values from the fourth frequency band, which values are at a distance of the fourth frequency resolution or a multiple of the fourth frequency resolution from each other;

producing the second intermediate frequency signal 71, which has the second intermediate frequency, by converting the second input signal 70 by the third local oscillator signal 74;

producing the second output signal 72 by up-converting the second intermediate frequency signal 71 by the fourth local oscillator signal 76;

transmitting said second output signal.

The determining of the second output frequency from the output frequency band takes place, for example, by providing the transmitter with the information about the output frequency to be used next or about the size of the change by which the current output frequency will be changed. The second output signal 72 is preferably a radio signal to be transmitted to a mobile communication network. The output frequency band is preferably defined on the basis of the frequency range of the mobile communication network. The output frequency resolution is preferably the mobile communication system's channel spacing. The second input signal 70 is preferably a signal that arrives from the modulator of a mobile station.

The bases of a method and a transmitter according to the invention are the same as those of the receiver shown in FIG. 4. This being the case, in the transmitter, the second intermediate frequency signal 71 has a second intermediate frequency resolution, which is higher than the output frequency resolution. In this case, frequency synthesisers, the frequency resolutions of which are higher than the output frequency resolution, can be used as local oscillators and, thus, reduce the transmitter's settling time without the output frequency resolution being impaired. The third local oscillator has a third frequency resolution. The third frequency resolution and the fourth frequency resolution are both higher than the output frequency resolution.

The second intermediate frequency obtains values from the second intermediate frequency band, which values are at a distance of the second intermediate frequency resolution or a multiple of the second frequency resolution from each other. The second intermediate frequency band has at least as many values, as is the ratio of the fourth frequency resolution to the output frequency resolution. This being the case, the second output signal 72 can be formed of the values that belong to the second intermediate frequency band for all the values of the second output frequency that belong to the output frequency band. The second intermediate frequency band is defined on the basis of the properties of the one or more band-pass filters used in filtering means 85 and the requirements set on the time for the transmitter's frequency change.

The frequency of the third local oscillator signal 74 obtains values from the third frequency band, which values are at a distance of the third frequency resolution or a multiple of the third frequency resolution from each other. The third frequency band has at least as many values, as the second intermediate frequency band has frequencies.

A method according to the invention comprises further a step, wherein the frequency of the third local oscillator signal 74 is adjusted so that it is the difference or sum of the second intermediate frequency and the second input frequency, and the frequency of the fourth local oscillator signal 76 so that it is the difference or sum of the second output frequency and the second intermediate frequency, and which said value of the second intermediate frequency is set from the second intermediate frequency band on the basis of the second output frequency and the fourth frequency resolution. The difference or sum is defined on the basis whether a lower or upper injection is used in the transmitter.

In a method and a transmitter implementing the method, according to the invention, the fourth frequency resolution is the output frequency resolution multiplied by a fourth integer, which is higher than one. Furthermore, the third local oscillator has the third frequency resolution, which is the output frequency resolution multiplied by a fifth integer, which is higher than one. The only common integer factor of the fourth and fifth integers is one. If the fourth integer is two, any odd number can be used as the value of the fifth integer, because the integer factors of an odd integer are always unequal to two. When the fourth integer is six, the value of the fifth integer can be, for example, five or seven. Because six has two and three as integer factors that are higher than one, the fifth integer must not be such a number wherein one or both of these integer factors occur. In this case, the fifth integer cannot be, for example, two, eight, nine or fifteen.

The second intermediate frequency resolution is the third frequency resolution multiplied by a sixth integer. In one preferred embodiment, the sixth integer is one, i.e. the second intermediate frequency resolution is equal to the third frequency resolution. If the second intermediate frequency resolution is equal to the third frequency resolution, it is possible to produce from the second input frequency values of the second intermediate frequency band with the desired second intermediate frequency resolution. If the intermediate frequency resolution is higher than the third frequency resolution, frequencies with a lower resolution can be produced by the third local oscillator. If, for example, the second intermediate frequency resolution is 0.8 MHz and the third frequency resolution is 0.4 MHz, every second frequency of the third local oscillator signal 74 can be left unused and increase the frequency of the third local oscillator signal 74 in steps of the size of 0.8 MHz.

The second intermediate frequency resolution can be easily found with the help of the following rule. If the fourth integer is x, and the intermediate frequency resolution is the output frequency resolution multiplied by the integer y, not one of the values in the series $[1 \ldots x-1]*y$ is divisible by x. If the fourth frequency resolution is, for example, six-fold, the second intermediate frequency resolution cannot be the output frequency resolution multiplied by two because, in the series 2, 4, 6, 8, 10, the number six is divisible by six. Instead, a five-fold second intermediate frequency resolution can be used because, in the series 5, 10, 15, 20, 25, not one of the numbers is divisible by six.

A control unit 69, the operation of which is well known to a person skilled in the art, can be used for controlling the third 73 local oscillator, the fourth 75 local oscillator and filtering means 85. Means for setting the value of the second intermediate frequency can also be placed in the same or separate control unit. The setting of the value of the second intermediate frequency comprises the steps of:

a) selecting a value from the second intermediate frequency band;
b) defining the difference or sum of the second output frequency and the selected value;
c) defining the quotient of the difference or sum and the fourth frequency resolution;
d) defining the remainder of the quotient;
e) if the remainder is zero, setting the selected value as the second intermediate frequency;
f) if the remainder is not zero, selecting the next value from the second intermediate frequency band, and repeating the steps b–f.

The steps b–f are repeated until the remainder of the quotient is zero.

In response to the change in the second output frequency, which is equal to the fourth frequency resolution or a multiple of the fourth frequency resolution, the second intermediate frequency and the frequency of the third local oscillator signal 74 are constant.

The second intermediate frequency signal 71 is produced, for example, by intermixing the second input signal 70 and the third local oscillator signal 74. The produced mixing products are filtered by the filtering means 85, which comprise one or more band-pass filters for producing the second intermediate frequency with the values of the second intermediate frequency band. The filtering means comprise an input 86 for receiving the mixing products produced by the mixer 77, one or more band-pass filters for producing the second intermediate frequency with the values of the second intermediate frequency band, as well as an output 87 for outputting the intermediate frequency signal 71 at a specific second intermediate frequency.

In the transmitter, one or more frequency synthesisers based on a phase-locked loop are preferably used as the third local oscillator 73 and the fourth local oscillator 75.

Figure 6:
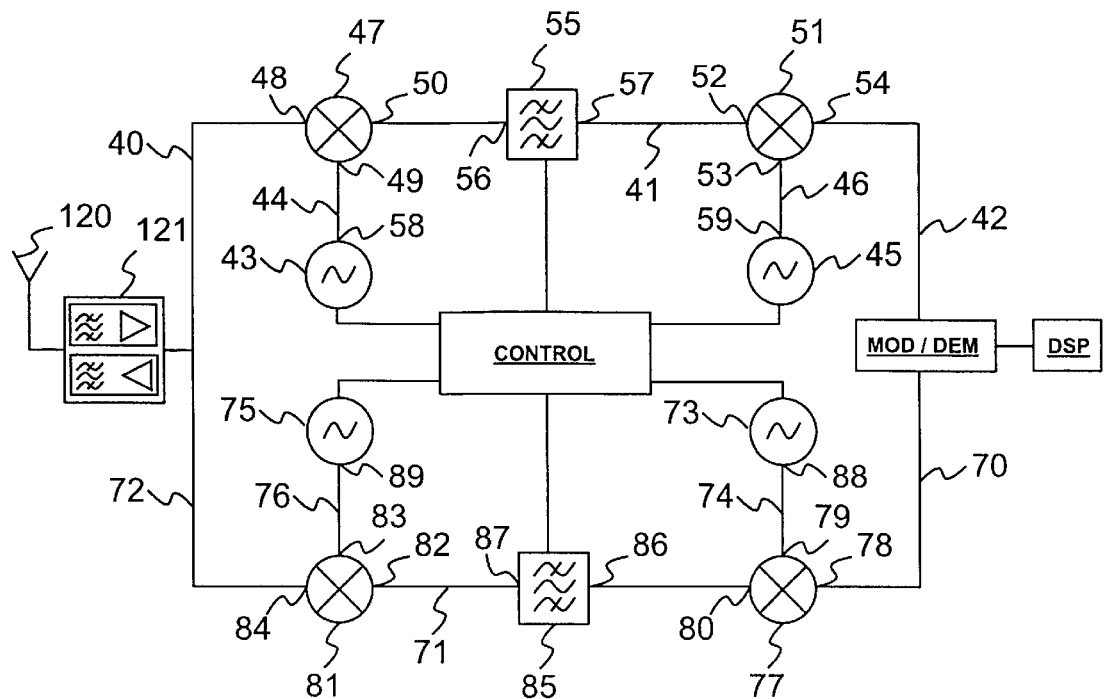
FIG. 6 is a block diagram of a mobile station comprising a transmitter and a receiver according to the invention, that implements methods according to the invention.

FIG. 6 shows a mobile station that implements the methods according to the invention. It is illustrated in principle and the figure only comprises the most essential parts required for the understanding of the operating principle of the mobile station that implements the methods according to the invention.

A mobile station for producing the first output signal 42 from the first input signal 40, and for producing the second output signal 72 from the second input signal 70, which mobile station comprises:

a receiver for producing said first output signal 42, which has a specific output frequency, from said first input signal 40, which has an input frequency resolution and a first input frequency belonging to an input frequency band, which is arranged to change in steps of the size of the input frequency resolution or a multiple of the input frequency resolution on the input frequency band;

a transmitter for producing said second output signal 72, which has a second frequency resolution and a second output frequency belonging to an output frequency band, from said second input signal 70, which has a specific second input frequency, and further for changing the second output frequency in steps of the size of the output frequency resolution or a multiple of the output frequency resolution, on the output frequency band;

an antenna 120 for receiving the firs input signal 40 and for transmitting the second output signal 72;

a pre- and output stage 121 for amplifying and filtering the first input signal 40 and the second output signal 72;

a signal processing unit DSP for processing the first output signal 42 and for producing the second input signal 70;

a modem unit MOD/DEM for demodulating the first output signal 42 and for modulating the second input signal 70;

a control unit for controlling the first local oscillator 43, the second local oscillator 45, the third local oscillator 73, the fourth local oscillator 75, the first filtering means 55 and the second filtering means 85.

The receiver comprises the parts shown in FIG. 4 and the transmitter the parts shown in FIG. 5, where the numbers of FIG. 6 refer to the corresponding numbers in FIGS. 4 and 5.

The operation of the mobile station is well known to a person skilled in the art. Therefore, as for the use of methods and a transmitter and receiver that implement the methods according to the invention, a reference is made here to what has been stated in the particular part of the application concerning FIGS. 4 and 5.

Figure 7:
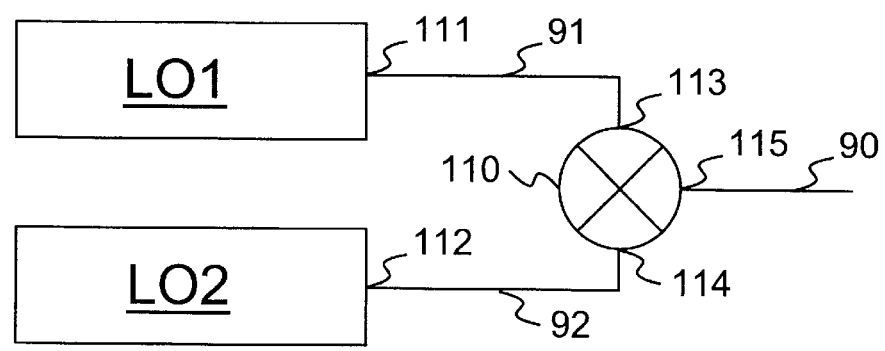
FIG. 7 shows a frequency synthesiser based on a method according to the invention.

FIG. 7 shows a frequency synthesiser based on a method according to the invention. It is illustrated in principle and the figure only comprises the most essential parts required for the understanding of the operating principle of a method and a frequency synthesiser according to the invention.

A frequency synthesiser, based on a method according to the invention, for producing a third output signal 90, which has a third output frequency and a third output frequency resolution, and for changing the third output frequency in steps of the size of the third output frequency resolution or a multiple of the third output frequency resolution, comprises:

a fifth local oscillator LO1, which has a fifth frequency resolution, for producing a fifth local oscillator signal 91, which fifth local oscillator signal has an adjustable frequency, which frequency obtains values from a fifth frequency band, and which values are at a distance of the fifth frequency resolution or a multiple of the fifth frequency resolution from each other;

a sixth local oscillator LO2, which has a sixth frequency resolution, for producing a sixth local oscillator signal 92, which sixth local oscillator signal has an adjustable frequency, which frequency obtains values from a sixth frequency band, and which values are at a distance of the sixth frequency resolution or a multiple of the sixth frequency resolution from each other;

a fifth mixer 110 for producing the third output signal at the third output frequency from the fifth local oscillator signal 91 and from the sixth local oscillator signal 92;

which fifth local oscillator LO1 comprises a first output 111 for outputting the fifth local oscillator signal 91, which sixth local oscillator LO2 comprises a second output 112 for outputting the sixth local oscillator signal 92, and which fifth mixer 110 comprises a first input 113 for receiving the fifth local oscillator signal 91, a second input 1145 for receiving the sixth local oscillator signal 92 and an output 115 for outputting the third output signal 90.

A method for producing the third output signal 90, which has a third output frequency and a third output frequency resolution, and for changing the third output frequency in steps of the size of the third output frequency resolution or a multiple of the third output frequency resolution comprises the steps of:
  determining the third output frequency;
  producing the fifth local oscillator signal 91, which has a frequency, by the fifth local oscillator LO1, which has the fifth frequency resolution, which frequency of the fifth local oscillator signal obtains values from the fifth frequency band, and which values are at a distance of the fifth frequency resolution or a multiple of the fifth frequency resolution from each other;
  producing the sixth local oscillator signal 92, which has a frequency, by the sixth local oscillator LO2, which has the sixth frequency resolution, which frequency of the sixth local oscillator signal obtains values from the sixth frequency band and which (values) are at a distance of the sixth frequency resolution or a multiple of the sixth frequency resolution from each other;
  setting the frequency of the fifth local oscillator signal 91 from the fifth frequency band and the frequency of the sixth local oscillator signal 92 from the sixth frequency band so that the sum of the fifth local oscillator frequency and the sixth local oscillator frequency is equal to the third output frequency;
  producing the third output signal 90 at the third output frequency by intermixing the fifth local oscillator signal 91 and the sixth local oscillator signal 92.

In a method and a frequency synthesiser that implements the method according to the invention, the fifth frequency resolution is the third output frequency resolution multiplied by a seventh integer, and the sixth frequency resolution is the third output frequency resolution multiplied by an eighth integer. The seventh and eighth integers are higher than one. The seventh and eighth integers are set so that their only common integer factor is one. Thus, it is possible to produce the desired third output signal with the third output frequency resolution by using two local oscillators the frequency resolution of which is higher than the third output frequency resolution.

The fifth frequency band can be, for example, 601.2–640.8 MHz with the fifth frequency resolution of 1.2 MHz, and the sixth frequency band can be, for example, 194–199 MHz with the sixth frequency resolution of 1 MHz. Thus, it is possible to produce the third output frequency between 800.2–834.8 with the output frequency resolution of 0.2 MHz. For controlling the fifth and sixth local oscillators, for example, a control unit is used in manner well known to a person skilled in the art. The fifth local oscillator LO1 and the sixth local oscillator LO2 are preferably frequency synthesiser based on a phase-locked loop. The frequency synthesisers are preferably either conventional frequency synthesisers or fractional-n synthesisers.

This paper presents the implementation and embodiments of the invention with the help of examples. A person skilled in the art will appreciate that the present invention is not restricted to details of the embodiments presented above and that the invention can also be implemented in another form without deviating from the characteristics of the invention. The presented embodiments should be regarded as illustrative but not restricting. Thus, the possibilities of implementing and using the invention are only restricted by the enclosed claims, and the various options of implementing the invention as determined by the claims, including the equivalent implementations, also belong to the scope of the invention.

What is claimed is:

1. A method for producing a first output signal (42), which has a specific first output frequency, in a receiver from a first input signal (40), which has an input frequency resolution and a first input frequency belonging to an input frequency band, which changes in steps of the size of the input frequency resolution or a multiple of the input frequency resolution on the input frequency band, and which method comprises the steps of:
  determining said first input frequency from the input frequency band;
  producing a first local oscillator signal (44), which has a frequency, by a first local oscillator (43), which has a first frequency resolution, the first local oscillator signal (44) obtains frequency values from a first frequency band and which values are at a distance of the first frequency resolution or a multiple of the first frequency resolution from each other;
  producing a second local oscillator signal (46), which has a frequency, by a second local oscillator (45);
  receiving said first input signal;
  producing a first intermediate frequency signal (41), which has a first intermediate frequency, by converting the first input signal (40) by the first local oscillator signal (44);
  producing a first output signal (42) by down-converting the first intermediate frequency signal (41) by a second local oscillator signal (46),
characterised in that
  the first intermediate frequency signal (41) has a first intermediate frequency resolution, which is higher than the input frequency resolution;
  the first intermediate frequency signal obtains frequency values from a first intermediate frequency band, which values are at a distance of the first intermediate frequency resolution or a multiple of the first intermediate frequency resolution from each other;
  the first frequency resolution is higher than the input frequency resolution;
  the second local oscillator (45) has a second frequency resolution, which is higher than the input frequency resolution, and the frequency of the second local oscillator signal (46) obtains frequency values from a second frequency band, which values are at a distance of the second frequency resolution or a multiple of the second frequency resolution from each other; and
that the method further comprises the steps of:
  adjusting the difference or sum of the first intermediate frequency and the first input frequency as the frequency of the first local oscillator signal (44) and the difference or sum of the first intermediate frequency and the first output frequency as the frequency of the second local oscillator signal (46), so that the value of said first intermediate frequency is determined from the first intermediate frequency band on the basis of the first input frequency and the first frequency resolution.

2. A method according to claim 1, characterised in that
  the first frequency resolution is the input frequency resolution multiplied by a first integer, which is higher than one;
  the second frequency resolution is the input frequency resolution multiplied by a second integer, which is higher than one;
  the only common integer factor of the first integer and the second integer is one.

3. A method according to claim 1, characterised in that the first intermediate frequency band has at least as many values, as is the ratio of the first frequency resolution to the input frequency resolution.

4. A method according to claim 2, characterised in that the first intermediate frequency resolution is the second frequency resolution multiplied by a third integer.

5. A method according to claim 1, characterised in that the second frequency band has at least as many values, as the first intermediate frequency band has frequencies.

6. A method according to claim 1, characterised in that the setting of the value of the first intermediate frequency comprises the steps of:
   a) selecting a value from the first intermediate frequency band;
   b) defining the difference or sum of the first input frequency and the selected value;
   c) defining the quotient of the difference or sum and the first frequency resolution;
   d) defining the remainder of the quotient;
   e) if the remainder is zero, determining the selected value as the first intermediate frequency;
   f) if the remainder is not zero, selecting the next value from the first intermediate frequency set and repeating the steps b–f.

7. A method according to claim 1, characterised in that in response to the change in the first input frequency, which is equal to the first frequency resolution or a multiple of the first frequency resolution, the first intermediate frequency and the frequency of the second local oscillator signal (46) are maintained constant.

8. A method according to claim 1, characterised in that it comprises producing the first intermediate frequency signal (41) by intermixing the first input signal (40) and the first local oscillator signal (44) and filtering obtained mixing products by filtering means (55), which comprise one or more band-pass filters for producing the first intermediate frequency with the values of the first intermediate frequency band.

9. A method according to claim 1, characterised in that it comprises using a frequency synthesiser based on a phase-locked loop as the first local oscillator (43).

10. A method according to claim 1, characterised in that it comprises using a frequency synthesiser based on a phase-locked loop as the second local oscillator (45).

11. A method for producing a second output signal (72), which has an output frequency resolution and a second output frequency belonging to an output frequency band, in a transmitter from a second input signal (70), which has a specific second input frequency, and further for changing the second output frequency in steps of the size of the output frequency resolution or a multiple of the output frequency resolution on the output frequency band, which method comprises the steps of:
   determining said second output frequency from the output frequency band;
   producing a third local oscillator signal (74), which has a frequency, by a third local oscillator (73);
   producing a fourth local oscillator signal (76), which has a frequency, by a fourth local oscillator (75), which has a fourth frequency resolution, the fourth local oscillator signal obtains frequency values from a fourth frequency band, which values are at a distance of the fourth frequency resolution or a multiple of the fourth frequency resolution from each other;
   producing a second intermediate frequency signal (71), which has a second intermediate frequency, by converting the second input signal (70) by the third local oscillator signal (74);
   producing the second output signal (72) by up-converting the second intermediate frequency signal (71) by the fourth local oscillator signal (76);
   transmitting said second output signal;
characterised in that
   the second intermediate frequency signal (71) has a second intermediate frequency resolution, which is higher than the output frequency resolution;
   the second intermediate frequency signal obtains frequency values from a second intermediate frequency band, which values are at a distance of the second intermediate frequency resolution or a multiple of the second intermediate frequency resolution from each other;
   the fourth frequency resolution is higher than the output frequency resolution;
   the third local oscillator (73) has a third frequency resolution, which is higher than the output frequency resolution, and the the third local oscillator signal (74) obtains frequency values from a third frequency band, which values are at a distance of the third frequency resolution or a multiple of the third frequency resolution from each other; and
   which method comprises further a step of adjusting the difference or sum of the second intermediate frequency and the second input frequency as the frequency of the third local oscillator signal (74) and the difference or sum of the second output frequency and a specific second intermediate frequency as the frequency of the fourth local oscillator signal (76), so that the value of the second intermediate frequency is determined from the second intermediate frequency band on the basis of the second output frequency and the fourth frequency resolution.

12. A method according to claim 11, characterised in that
   the fourth frequency resolution is the output frequency resolution multiplied by a fourth integer, which is higher than one;
   the third local oscillator has the third frequency resolution, which is the output frequency resolution multiplied by a fifth integer, which is higher than one;
   the only common integer factor of the fourth integer and the fifth integer is one.

13. A method according to claim 11, characterised in that the second intermediate frequency band has at least as many values, as is the ratio of the fourth frequency resolution to the output frequency resolution.

14. A method according to claim 12, characterised in that the second intermediate frequency resolution is the third frequency resolution multiplied by a sixth integer.

15. A method according to claim 11, characterised in that the third frequency band has at least as many values, as the second intermediate frequency band has frequencies.

16. A method according to claim 11, characterised in that the setting of the value of the second intermediate frequency comprises the steps of:
   a) selecting a value from the second intermediate frequency set;
   b) defining the difference or sum of the second output frequency and the selected value;
   c) defining the quotient of the difference or sum and the fourth frequency resolution;
   d) defining the remainder of the quotient;

e) if the remainder is zero, determining the selected value as the second intermediate frequency;

f) if the remainder is not zero, selecting the next value from the second intermediate frequency band and repeating the steps b–f.

17. A method according to claim 11, characterised in that in response to the change in the second output frequency, which is equal to the fourth frequency resolution or a multiple of the fourth frequency resolution, the second intermediate frequency and the frequency of the third local oscillator signal (74) are maintained constant.

18. A method according to claim 11, characterised in that it comprises producing the second intermediate frequency signal (71) by intermixing the second input signal (70) and the third local oscillator signal (74) and filtering the obtained mixing products by filtering means (85), which comprise one or more band-pass filters for producing the second intermediate frequency with the values of the second intermediate frequency band.

19. A method according to claim 11, characterised in that it comprises using a frequency synthesiser based on a phase-locked loop as the third local oscillator (73).

20. A method according to claim 11, characterised in that it comprises using a frequency synthesiser based on a phase-locked loop as the fourth local oscillator (75).

21. A receiver for producing a first output signal (42), which has a specific output frequency, from a first input signal (40), which has an input frequency resolution and a first input frequency belonging to an input frequency band, which is arranged to change in steps of the size of the input frequency resolution or a multiple of the input frequency resolution on the input frequency band, which receiver comprises:

a first local oscillator (43), which has a first frequency resolution, for producing a first local oscillator signal (44), which first local oscillator signal has an adjustable frequency and obtains frequency values from a first frequency band, and which values are at a distance of the first frequency resolution or a multiple of the first frequency resolution from each other;

a second local oscillator (45) for producing a second local oscillator signal (46), which has a frequency;

a first mixer (47) for producing a first intermediate frequency signal (41), which first mixer is arranged to convert the first input signal (40) by the first local oscillator signal (44), which first mixer has a radio frequency input (48) for receiving the first input signal, a local oscillator input (49) for receiving the first local oscillator signal and a first intermediate frequency output (50) for outputting the first intermediate frequency signal;

a second mixer (51) for producing the first output signal (42), which second mixer is arranged to down-convert the first intermediate frequency signal (41) by the second local oscillator signal (46), and which second mixer has an intermediate frequency input (52) for receiving the first intermediate frequency signal, a local oscillator input (53) for receiving the second local oscillator signal and a second intermediate frequency output (54) for outputting the first output signal;

which first local oscillator comprises:

a first local oscillator output (58) for outputting the first local oscillator signal (44);

and which second local oscillator comprises:

a second local oscillator output (59) for outputting the second local oscillator signal (46), characterised in that the first intermediate frequency signal (41) has a first intermediate frequency resolution, which is higher than the input frequency resolution;

the first intermediate frequency signal is arranged to obtain frequency values from a first intermediate frequency band, which values are at a distance of the first intermediate frequency resolution or a multiple of the first intermediate frequency resolution from each other; and the first frequency resolution is higher than the input frequency resolution;

the second local oscillator (45) has a second frequency resolution, which is higher than the input frequency resolution;

the frequency of the second local oscillator signal (46) is adjustable and the second local oscillator signal is arranged to obtain frequency values from a second frequency band, which values are at a distance of the second frequency resolution or a multiple of the second frequency resolution from each other.

22. A receiver according to claim 21, characterised in that the first frequency resolution is the input frequency resolution multiplied by a first integer, which is higher than one;

the second frequency resolution is the input frequency resolution multiplied by a second integer, which is higher than one; and the only common integer factor of the first integer and the second integer is one.

23. A receiver according to claim 21, characterised in that the first intermediate frequency band has at least as many values, as is the ratio of the first frequency resolution to the input frequency resolution.

24. A receiver according to claim 22, characterised in that the first intermediate frequency resolution is the input frequency resolution multiplied by a third integer.

25. A receiver according to claim 21, characterised in that the second frequency band has at least as many values, as the first intermediate frequency band has values.

26. A receiver according to claim 21, characterised in that the receiver comprises filtering means (55) for filtering the mixing products of the first mixer (47), which filtering means (55) comprise an input (56) for receiving the mixing products of the first mixer, one or more band-pass filters for producing the first intermediate frequency with the values of the first intermediate frequency band, as well as an output (57) for outputting the first intermediate frequency signal at the first intermediate frequency.

27. A receiver according to claim 21, characterised in that the receiver comprises a control unit (60) for determining the value of the first intermediate frequency from the first intermediate frequency band on the basis of the first input frequency and the first frequency resolution and for controlling the first local oscillator (43), the second local oscillator (45) and the filtering means (55).

28. A transmitter for producing a second output signal (72), which has a second frequency resolution and a second output frequency belonging to an output frequency band, from a second input signal (70), which has a specific second input frequency, and further for changing the second output frequency in steps of the size of the output frequency resolution or a multiple of the output frequency resolution, on the output frequency band, which transmitter comprises:

a third local oscillator (73) for producing a third local oscillator signal (74);

a fourth local oscillator (75), which has a fourth frequency resolution, for producing a fourth local oscillator signal (76), which fourth local oscillator has an adjustable frequency and obtains frequency values from a fourth frequency band, and which values are at a distance of the fourth frequency resolution or a multiple of the fourth frequency resolution from each other;

a third mixer (77) for producing a second intermediate frequency signal (71), which third mixer is arranged to convert the second input signal (70) by the third local oscillator signal (74), which third mixer has an intermediate frequency input (78) for receiving the second input signal, a third local oscillator input (79) for receiving the third local oscillator signal and a second intermediate frequency output (80) for outputting the second intermediate frequency signal;

a fourth mixer (81) for producing the second output signal, which fourth mixer is arranged to up-convert the second intermediate frequency signal (71) into the second output signal (72) by the fourth local oscillator signal (76), which fourth mixer (81) has an intermediate frequency input (82) for receiving the second intermediate frequency signal, a local oscillator input (83) for receiving the fourth local oscillator signal and a radio frequency output (84) for outputting the second output signal, which third local oscillator (73) comprises:
a third local oscillator output (88) for outputting the third local oscillator signal (74), which fourth local oscillator (75) comprises:
a fourth local oscillator output (89) for outputting the fourth local oscillator signal (76), characterised in that
the second intermediate signal has a second intermediate frequency resolution, which is higher than the output frequency resolution;
the second intermediate frequency signal is arranged to obtain frequency values from the second intermediate frequency band, which values are at a distance of the second intermediate frequency resolution or a multiple of the second intermediate frequency resolution from each other;
the fourth frequency resolution is higher than the output frequency resolution;
the third local oscillator (73) has a third frequency resolution, which is higher than the output frequency resolution;
the frequency of the third local oscillator signal (74) is adjustable and the third local oscillator signal is arranged to obtain frequency values from a third frequency band, which values are at a distance of the third frequency resolution or a multiple of the third frequency resolution from each other.

29. A transmitter according to claim 28, characterised in that
the fourth frequency resolution is the output frequency resolution multiplied by a fourth integer, which is higher than one;
the third frequency resolution is the output frequency resolution multiplied by a fifth integer, which is higher than one; and
the only common integer factor of the fourth integer and the fifth integer is one.

30. A transmitter according to claim 28, characterised in that the second intermediate frequency band has at least as many values, as is the ratio of the fourth frequency resolution to the output frequency resolution.

31. A transmitter according to claim 29, characterised in that the second intermediate frequency resolution is the output frequency resolution multiplied by an integer.

32. A transmitter according to claim 28, characterised in that the third frequency band has at least as many values, as the second intermediate frequency band has values.

33. A transmitter according to claim 28, characterised in that the transmitter comprises filtering means (85) for filtering the mixing products of the third mixer (77), which filtering means (85) comprise an input (86) for receiving the mixing products of the third mixer, one or more band-pass filters for producing the second intermediate frequency with the values of the second intermediate frequency band, as well as an output (87) for outputting the second intermediate frequency signal (71) at a specific second intermediate frequency.

34. A transmitter according to claim 28, characterised in that the transmitter comprises a control unit (69) for setting the value of the second intermediate frequency from the second intermediate frequency band on the basis of the second output frequency and the fourth frequency resolution, as well as for controlling the third local oscillator (73), the fourth local oscillator (75) and the filtering means (85).

35. The method of claim 1, where said method is executed in a mobile station.

36. A mobile station for producing a first output signal (42) from a first input signal (40) and for producing a second output signal (72) from a second input signal, which mobile station comprises:

a receiver for producing said first output signal (42), which has a specific output frequency, from said first input signal (40), which has an input frequency resolution and a first input frequency belonging to an input frequency band, which is arranged to change in steps of the size of the input frequency resolution or a multiple of the input frequency resolution, on the input frequency band;

a transmitter for producing said second output signal (72), which has a second frequency resolution and a second output frequency belonging to an output frequency band, from said second input signal (70), which has a specific second input frequency, and further for changing the second output frequency in steps of the size of the output frequency resolution or a multiple of the output frequency resolution, on the output frequency band;

an antenna (120) for receiving the first input signal and for transmitting the second output signal;

a pre- and output stage (121) for amplifying and filtering the first input signal (40) and the second output signal (72);

a signal processing unit (DSP) for processing the first output signal and for producing the second input signal:

a modem unit (MOD/DEM) for demodulating the first input signal and for modulating the second input signal, which receiver comprises:
a first local oscillator (43), which has a first frequency resolution, for producing a first local oscillator signal (44), which first local oscillator signal has an adjustable frequency and obtains frequency values from a first frequency band, and which values are at a distance of the first frequency resolution or a multiple of the first frequency resolution from each other;

a second local oscillator (45) for producing a second local oscillator signal (46) which has a frequency;

a first mixer (47) for producing a first intermediate frequency signal (41), which first mixer is arranged to convert the first input signal (40) by the first local oscillator signal (44), which first mixer has a radio frequency input (48) for receiving the first input signal, a local oscillator input (49) for receiving the first local oscillator signal and a first intermediate frequency output (50) for outputting the first intermediate frequency signal;

a second mixer (51) for producing the first output signal (42), which second mixer is arranged to down-convert the first intermediate frequency signal (41) by the second local oscillator signal (46), and which second mixer has an intermediate frequency input (52) for receiving the first intermediate frequency signal, a local oscillator input (53) for receiving the second local oscillator signal and a second intermediate frequency output for outputting the first output signal, and which first local oscillator comprises:
a first local oscillator output (58) for outputting the first local oscillator signal (44), and which second local oscillator comprises:
a second local oscillator output (59) for outputting the second local oscillator signal (46), which transmitter comprises:
a third local oscillator (73) for producing a third local oscillator signal (74);
a fourth local oscillator (75), which has a fourth frequency resolution, for producing a fourth local oscillator signal (76), which fourth local oscillator has an adjustable frequency and obtains frequency values for a fourth frequency band, and which values are at a distance of the fourth frequency resolution or a multiple of the fourth frequency resolution from each other;
a third mixer (77) for producing a second intermediate frequency signal (71), which third mixer is arranged to convert the second input signal (70) by the third local oscillator signal (74), which third mixer has an intermediate frequency input (78) for receiving the second input signal, a third local oscillator input (79) for receiving the third local oscillator signal and a second intermediate frequency output (80) for outputting the second intermediate frequency signal;
a fourth mixer (81) for producing the second output signal, which fourth mixer is arranged to up-convert the second intermediate frequency signal (71) into the second output signal (72) by the fourth local oscillator signal (76), which fourth mixer (81) had an intermediate frequency input (82) for receiving the second intermediate frequency signal, a local oscillator input (83) for receiving the fourth local oscillator signal and a radio frequency output (84) for outputting the second output signal, and which third local oscillator (73) comprises:
a third local oscillator output (88) for outputting the third local oscillator signal (74), which fourth local oscillator (75) comprises:
a fourth local oscillator output (89) for outputting the fourth local oscillator signal (76), and which mobile station further comprises:
a control unit for controlling the first local oscillator (43), the second local oscillator (45), the third local oscillator (73), the fourth local oscillator (75), the first filtering means (55) and the second filtering means (85), characterised in that
the first frequency resolution is higher than the input frequency resolution;
the second local oscillator has a second frequency resolution, which is higher than the input frequency resolution;
the first intermediate frequency signal has a first intermediate frequency resolution, which is higher than the input frequency resolution;
the first intermediate frequency signal is arranged to obtain frequency values from a first intermediate frequency band, which values are at a distance of the first intermediate frequency resolution or a multiple of the first intermediate frequency resolution from each other;
the frequency of the second local oscillator signal is adjustable and the second local oscillator signal is arranged to obtain frequency values from a second frequency band, which values are at a distance of the second frequency resolution or a multiple of the second frequency resolution from each other,
the fourth frequency resolution is higher than the output frequency resolution;
the third local oscillator (73) has a third frequency resolution, which is higher than the output frequency resolution;
the second intermediate frequency signal has a second intermediate frequency resolution, which is higher than the output frequency resolution;
the second intermediate frequency signal is arranged to obtain frequency values from a second intermediate frequency band, which values are at a distance of the second intermediate frequency resolution or a multiple of the second intermediate frequency resolution from each other; and
the frequency of the third local oscillator signal (74) is adjustable and the third local oscillator signal is arranged to obtain frequency values from a third frequency band, which values are at a distance of the third frequency resolution or a multiple of the third frequency resolution from each other.

37. A method for producing a third output signal (90), which has a third output frequency and a third output frequency resolution, and for changing the third output frequency in steps of the size of the third output frequency resolution or a multiple of the third output frequency resolution, which method comprises the steps of:

determining the third output frequency;
producing a fifth local oscillator signal (91), which has a frequency, by a fifth local oscillator (LO1), which has a fifth frequency resolution, which fifth local oscillator signal obtains frequency values from a fifth frequency band, and which values are at a distance of the fifth frequency resolution or a multiple of the fifth frequency resolution from each other;
producing a sixth local oscillator signal (92), which has a frequency, by a sixth local oscillator (LO2), which has a sixth frequency resolution, which sixth local oscillator signal obtains frequency values from a sixth frequency band and which (values) are at a distance of the sixth frequency resolution or a multiple of the sixth frequency resolution from each other;
determining the frequency of the fifth local oscillator signal (91) from the fifth frequency band and the frequency of the sixth local oscillator signal (92) from the sixth frequency band, so that the sum of the fifth local oscillator frequency and the sixth local oscillator frequency is equal to the third output frequency;

producing a third output signal (90) at a third output frequency by intermixing the fifth local oscillator signal (91) and the sixth local oscillator signal (92), characterised in that the fifth frequency resolution is the third output frequency resolution multiplied by a seventh integer, which is higher than one; and the sixth frequency resolution is the third output frequency resolution multiplied by an eighth integer, which is higher than one.

38. A method according to claim 37, characterised in that the only common integer factor of the seventh integer and the eighth integer is one.

39. A method according to claim 37, characterised in that it comprises using a frequency synthesiser based on a phase-locked loop as the fifth local oscillator (LO1).

40. A method according to claim 37, characterised in that it comprises using a frequency synthesiser based on a phase-locked loop as the sixth local oscillator (LO2).

41. A frequency synthesiser for producing a third output signal (90), which has a third output frequency and a third output frequency resolution, and for changing the third output frequency in steps of the size of the third output frequency resolution or a multiple of the third output frequency resolution, which frequency synthesiser comprises:

a fifth local oscillator (LO1), which has a fifth frequency resolution, for producing a fifth local oscillator signal (91), which fifth local oscillator signal has an adjustable frequency and obtains frequency values from a fifth frequency band, and which values are at a distance of the fifth frequency resolution or a multiple of the fifth frequency resolution from each other;

a sixth local oscillator (LO2), which has a sixth frequency resolution, for producing a sixth local oscillator signal (92), which sixth local oscillator signal has an adjustable frequency and obtains frequency values from a sixth frequency band, and which values are at a distance of the sixth frequency resolution or a multiple of the sixth frequency resolution from each other;

a fifth mixer (110) for producing the third output signal at the third output frequency from the fifth local oscillator signal (91) and from the sixth local oscillator signal (92), which fifth local oscillator (LO1) comprises:

a first output (111) for outputting the fifth local oscillator signal (91), which sixth local oscillator (LO2) comprises:

a second output (112) for outputting the sixth local oscillator signal (92), and which fifth mixer (110) comprises:

a first input (113) for receiving the fifth local oscillator signal (91), a second input (114) for receiving the sixth local oscillator signal (92) and an output (115) for outputting the third output signal (90), characterised in that the fifth frequency resolution is the third output frequency resolution multiplied by a seventh integer, which is higher than one;

the sixth frequency resolution is the third output frequency resolution multiplied by an eighth integer, which is higher than one.

42. A frequency synthesiser according to claim 41, characterised in that the only common integer factor of the seventh integer and the eighth integer is one.

43. A frequency synthesiser according to claim 41, characterised in that the fifth local oscillator (LO1) is a frequency synthesiser based on a phase-locked loop.

44. A frequency synthesiser according to claim 41, characterised in that the sixth local oscillator (LO2) is a frequency synthesiser based on a phase-locked loop.

45. The method of claim 11, where said method is executed in a mobile station.

* * * * *